United States Patent [19]

Okuaki

[11] Patent Number: 4,801,998
[45] Date of Patent: * Jan. 31, 1989

[54] EPROM DEVICE

[75] Inventor: Hiroshi Okuaki, Tokyo, Japan

[73] Assignee: Oki Electric Industry Co., Ltd., Tokyo, Japan

[*] Notice: The portion of the term of this patent subsequent to Feb. 2, 2005 has been disclaimed.

[21] Appl. No.: 33,863

[22] Filed: Apr. 3, 1987

Related U.S. Application Data

[63] Continuation of Ser. No. 766,294, Aug. 16, 1985, abandoned.

[30] Foreign Application Priority Data

Aug. 20, 1984 [JP] Japan .................. 59-171453

[51] Int. Cl.[4] ............ H01L 23/02; H01L 23/28; H01L 23/30; H01L 23/10
[52] U.S. Cl. ........................ 357/72; 357/74; 357/84
[58] Field of Search .............. 357/84, 72, 73, 68, 357/74

[56] References Cited

U.S. PATENT DOCUMENTS

| 4,250,347 | 2/1981 | Fierkens et al. ......... 174/52 FP |
| 4,450,461 | 5/1984 | Cook et al. ................ 357/72 |
| 4,635,165 | 1/1987 | Okuaki . | |
| 4,723,156 | 2/1988 | Okuaki ..................... 357/74 |

FOREIGN PATENT DOCUMENTS

| 0137660 | 10/1981 | Japan ................. 357/72 |
| 57-30351 | 2/1982 | Japan . | |
| 57-72338 | 5/1982 | Japan . | |
| 0107657 | 1/1983 | Japan ................. 357/84 |
| 0000159 | 1/1983 | Japan ................. 357/72 |
| 0043546 | 3/1983 | Japan ................. 357/84 |
| 57-59364 | 4/1983 | Japan . | |
| 58-106851 | 6/1983 | Japan . | |
| 0207656 | 12/1983 | Japan ................. 357/72 |
| 0167037 | 9/1984 | Japan ................. 357/72 |

Primary Examiner—Andrew J. James
Assistant Examiner—S. V. Clark
Attorney, Agent, or Firm—Wenderoth, Lind & Ponack

[57] ABSTRACT

An EPROM device having a hollow cap mounted on an insulating board covering an EPROM chip. The head portion of the hollow cap is made of material which passes UV rays therethrough. An UV ray transmitting resin fills at least a space between upper surface of the EPROM chip and an upper wall of the hollow cap and an injected resin fills the remaining spaces, so as to prevent the entry of moisture into the hollow cap.

12 Claims, 1 Drawing Sheet

EPROM DEVICE

This application is a continuation of application Ser. No. 766,294 filed Aug. 16, 1985 now abandoned.

BACKGROUND OF THE INVENTION

The present invention relates to an erasable programmable read-only memory (hereinafter called EPROM) device in which an EPROM chip is directly mounted on a printed circuit insulating board having conductive interconnection patterns formed on the main surface of the board.

An example of such an EPROM device has been proposed by the present inventor and is described in a Japanese application, Ser No. 224393/1983.

In FIG. 1, a printed board 1 made of insulating material, such as glass-filled epoxy resin, has a chip mounting portion 2 and conductive interconnection patterns 3 on the main surface thereof.

The chip mounting portion 2 is defined as one portion of the conductive interconnection patterns 3.

One end of each of the patterns 3 is adjacent to the chip mounting portion 2 and another end of the patterns 3 is connected to each of male connector terminals (not shown).

An EPROM chip 4 is mounted on the chip mounting portion 2 in such a manner that the upper surface thereof faces upward. Each of the pad electrons of the EPROM chip 4 is connected to one end of each of the patterns 3 with thin metal wires 6.

One of the pad electrodes of the EPROM chip 4 is connected to the chip mounting portion 2 with a thin metal wire 6a so as to make and ohmic contact with the substrate of the chip 4.

Then, the joint portion comprising the thin metal wires 6, 6a and the EPROM chip 4 are encapsulated by a hollow cap 7 made of material capable of transmitting UV(ultra violet) ray therethrough such as UV ray permeable glass (UV glass, quartz, alumina) or synthetic resin.

The cap 7 covering the aforementioned portion is securely fixed to the board 1 with synthetic resin 8 such as epoxy resin NPO-01 (a commercial name of a product supplied by Kyoto Ceramic Co., LTD. Japan).

The structure obtained above has such poor moisture resistance that water or corrosive ions, such as $Na^-$, $K^-$, $Cl^-$, penetrate into the cap 7 through the portion at which the board 1 and the cap 7 are joined or through the board 1 itself, thereby causing corrosion of electrodes or leakage between electrodes of the EPROM chip 4.

SUMMARY OF THE INVENTION

It is an object of the present invention to provide an EPROM device encapsulated in a package which prevents entry of moisture and corrosive ions therethrough.

It is another object of the present invention to provide an EPROM device having a high reliability.

According to the present invention, there is provided an EPROM device comprising: a printed circuit insulating board having a chip mounting portion and conductive interconnecting patterns thereon; one end of each pattern being adjacent to the chip mounting portion; an EPROM chip mounted on the chip mounting portion; the EPROM chip having a plurality of pad electrodes at the top surface thereof; members for connecting the pad electrodes to one end of each pattern; an UV ray transmitting hollow cap mounted on the insulating board covering the EPROM chip and the members; and an UV ray transmitting resin filling in the hollow cap, thereby preventing the entry of moisture into the hollow cap.

The above and other advantages of the invention will become more apparent from the following description and the accompanying drawings.

DETAILED DESCRIPTION OF THE PREFERRED EMBODIMENT

Figure 2:
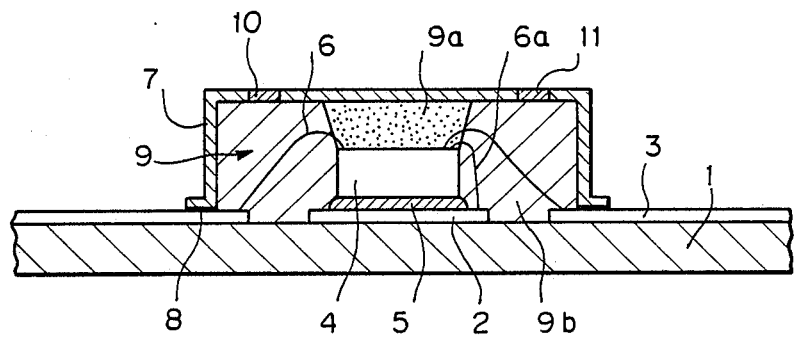
FIG. 2 is an elevational view of an EPROM device in accordance with the invention.
Figure 3:
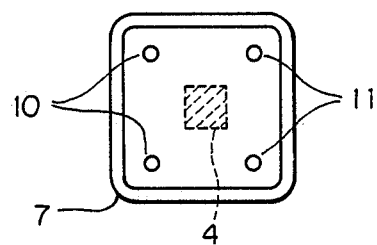
FIG. 3 is a partial top plane view of FIG. 2.

As shown in FIG. 2, the hollow cap 7 is filled with resin 9. The resin 9 comprises a first silicone resin 9a and a second silicone resin 9b.

The first silicone resin 9a filling the space above the EPROM chip 4 in the hollow cap 7 is capable of transmitting UV rays therethrough and is made of JCR 6122 or JCR 6127 (manufactured by Toray Co., Ltd. Japan), for example.

The second silicone resin 9b filling a remaining portion of the hollow cap 7 is not so capable of transmitting UV rays therethrough as the first silicone resin 9a, and is made of JCR 6116 (manufactured by Toray Co., Ltd. Japan), for example.

Figure 1:
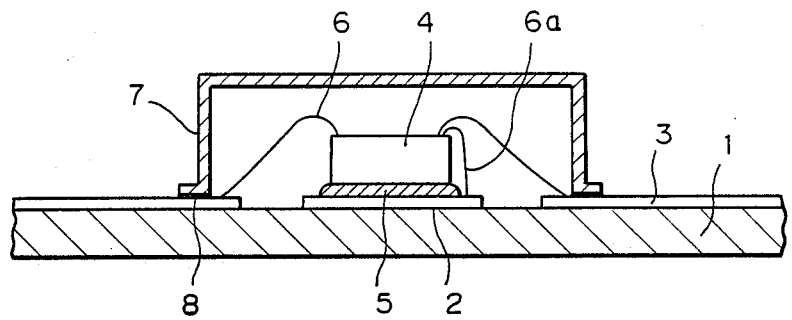
FIG. 1 is a prior art elevational view of an EPROM device proposed by the present inventor.

The remaining parts of the structure are nearly the same as those of the prior art shown in FIG. 1 except for a resin injection hole 10 and an air release hole 11 which are formed on the upper surface of the hollow cap 7, wherein the same reference characters denoted as in FIG. 1 denote similar parts.

The above mentioned EPROM device is manufactured as follows.

First, the EPROM chip 4 is mounted on the chip mounting portion 2. Then, the interconnection is performed with the thin metal wire 6.

Thereafter, the first silicone resin 9a capable of transmitting UV rays therethrough is provided by potting on the upper surface of the EPROM chip 4 to cover the same.

The structure manufactured by the above steps is covered with the hollow cap 7 before the first silicone resin 9a becomes hardened (within 1 to 2 hours), thereby obtaining the structure with the first silicone resin 9a filling the space between the upper wall of the hollow cap 7 and the upper surface of the EPROM chip 4.

Thereafter, the first silicone resin 9a is hardened by heating 1 to 2 hours at a temperature of 150° C. so as to fix the resin 9a to and over the upper surface of the EPROM chip 4.

In the process above, the synthetic resin 8 which acts as a binder is also hardened, the hollow cap 7 thereby being fixed on the surface of the printed circuit insulating board 1.

Then, the second silicone resin 9b is injected by potting into the hollow cap 7 through the resin pouring hole 10 to fill the remaining area of the hollow cap 7.

Then, the second silicone resin 9b is hardened by heating about 1 hour at a temperature of 150° C. about 1 hour at a temperature of 150° C. so that the resin 9b is fixed to the surfaces of the hollow cap 7, chip 4 and board 1 defining the remaining area within the hollow cap which is not filled by the first resin 9a.

With the EPROM device obtained by the steps described above, the upper surface of the EPROM chip 4 is exposed to UV rays when erasing the information stored therein.

For this reason, the first silicone resin 9a capable of transmitting UV rays therethrough is utilized as the resin which is poured onto the surface of the EPROM chip 4.

On the other hand, there is no need to make the remaining parts filled with resin capable of transmitting UV rays therethrough which is inferior to the second (UV ray impermeable) silicone resin 9b with respect to characteristics of reliability and physical stability.

Though the first silicone resin 9a can also be utilized to fill the remaining parts of the hollow cap 7, the embodiment shown in FIG. 2 adopts the second silicone resin 9b as the filler except for the necessary portion for exposure where the first silicone resin 9a is utilized.

According to the structure shown in FIG. 2, since the hollow cap 7 is filled and sealed with the resin 9, the entry of moisture or corrosive ions into the hollow cap 7 can be well prevented through the portion joining the board 1 and the cap 7 or the board 1 itself.

According to the embodiment, since almost every portion except for the surface of the EPROM chip 4 is filled with the second silicone resin 9b which is superior in reliability and various characteristics, the protective effect described above is excellent.

Accordingly, a highly reliable EPROM device can be obtained without the entry of moisture and corrosive ions causing the corrosion of the electrodes of the EPROM chip 4 or the leakage between the electrodes.

What is claimed is:

1. An EPROM device comprising:
   (a) an insulating board having a chip mounting portion and having conductive interconnecting patterns thereon; one end of each of said patterns being adjacent to said chip mounting portion;
   (b) an EPROM chip mounted on said chip mounting portion; said EPROM chip having a plurality of pad electrodes at a top surface thereof;
   (c) means for connecting said pad electrodes to said one end of each of said patterns;
   (d) an UV ray transmitting hollow cap fixedly mounted on said insulating board and covering said EPROM chip and said connecting means; said cap having an upper wall spaced from said EPROM chip and said board;
   (e) an UV ray transmitting resin filling at least a space between an upper surface of said EPROM chip and an upper wall of said hollow cap and fixed to said upper surface so as to define an optional path through said hollow cap and said UV ray transmitting resin to said upper surface; and
   (f) an injected resin filling a remaining space in said cap and fixed to inner surfaces of said cap, said board and said EPROM chip, whereby said cap, said UV ray transmitting resin and said injected resin seal said EPROM chip from the exterior of said device; said cap having means, including a resin injection hole and an air release hole, formed therein, for injection of said injected resin into said remaining space during manufacture of said EPROM device.

2. An EPROM device as in claim 1, wherein said injected resin is impermeable to UV rays.

3. An EPROM device as in claim 2, wherein said UV ray transmitting resin is potted directly onto said upper surface of said EPROM chip.

4. An EPRAM device as in claim 1, wherein said UV ray transmitting resin is potted directly onto said upper surface of said EPROM chip.

5. An EPROM device as in claim 2, wherein said UV ray transmitting resin and said injected resin are formed of silicone resins.

6. An EPROM device as in claim 1, wherein said UV ray transmitting resin and said injected resin are formed of silicone resins.

7. An EPROM device comprising:
   (a) an insulating board having a chip mounting portion and having conductive interconnecting patterns thereon; one end of each of said patterns being adjacent to said chip mounting portion and having conductive interconnecting patterns thereon; one end of each of said patterns being adjacent to said chip mounting portion;
   (b) an EPROM chip mounted on said chip mounting portion; said EPROM chip having a plurality of pad electrodes at a top surface thereof;
   (c) means for connecting said pad electrodes to said one end of each of said patterns;
   (d) a hollow cap comprised entirely of an UV ray transmitting material and fixedly mounted on said insulating board and covering said EPROM chip and said connecting means; said cap having an upper wall spaced from said EPROM chip and said board;
   (e) an UV ray transmitting resin filling a portion of a space within said hollow cap, said portion of said space being between said top surface of said EPROM chip and said upper wall of said hollow cap; said UV ray transmitting resin being fixed to said top surface and said upper wall so as to define an optical path through said hollow cap and said UV ray transmitting resin to said top surface; said UV ray transmitting resin surrounding said pad electrodes at said top surface of said EPROM chip and surrounding at least part of said connecting means; and
   (f) an injected resin filling the remainder of said space in said cap and being fixed to surfaces of said cap, said board and said EPROM chip which are not covered by said UV ray transmitting resin, whereby said cap, said UV ray transmitting resin and said injected resin seal said EPROM chip from the exterior of said device; said cap having resin injection hole means for injection of said injected resin into said remainder of said space during manufacture of said EPROM device and air release hole means for escape of air out of said hollow cap when said injected resin is injected through said resin injection hole means.

8. An EPROM device as in claim 7, wherein said injected resin is comprised of a material impermeable to UV rays.

9. An EPROM device as in claim 8, wherein said UV ray transmitting resin comprises an UV ray transmitting resin poured directly onto said upper surface of said EPROM chip.

10. An EPROM device as in claim 7, wherein said UV ray transmitting resin comprises an UV ray transmitting resin poured directly onto said upper surface of said EPROM chip.

11. An EPROM device as in claim 8, wherein said UV ray transmitting resin and said injected resin comprises silicone resins.

12. An EPROM device as in claim 7, wherein said UV ray transmitting resin and said injected resin comprise silicone resins.

* * * * *